United States Patent
Ichimura et al.

(10) Patent No.: US 8,455,823 B2
(45) Date of Patent: Jun. 4, 2013

(54) CHARGED PARTICLE BEAM DEVICE

(75) Inventors: Takashi Ichimura, Hitachinaka (JP); Takeshi Ogashiwa, Hitachinaka (JP); Yasuko Aoki, Hitachi (JP)

(73) Assignee: Hitachi High-Technologies Corporation, Tokyo (JP)

( * ) Notice: Subject to any disclaimer, the term of this patent is extended or adjusted under 35 U.S.C. 154(b) by 6 days.

(21) Appl. No.: 13/132,373

(22) PCT Filed: Nov. 11, 2009

(86) PCT No.: PCT/JP2009/005998
§ 371 (c)(1),
(2), (4) Date: Jun. 2, 2011

(87) PCT Pub. No.: WO2010/064360
PCT Pub. Date: Jun. 10, 2010

(65) Prior Publication Data
US 2011/0233399 A1   Sep. 29, 2011

(30) Foreign Application Priority Data

Dec. 2, 2008   (JP) .................................. 2008-306952

(51) Int. Cl.
*H01J 37/244* (2006.01)
*H01J 37/28* (2006.01)
*G01N 23/225* (2006.01)

(52) U.S. Cl.
USPC ........... 250/310; 250/305; 250/306; 250/307; 250/309

(58) Field of Classification Search
USPC .................. 250/305, 306, 307, 310
See application file for complete search history.

(56) References Cited

U.S. PATENT DOCUMENTS

| 5,576,833 | A |    | 11/1996 | Miyoshi et al. |
| 5,594,245 | A | *  | 1/1997  | Todokoro et al. ............. 250/310 |
| 5,608,218 | A |    | 3/1997  | Sato et al. |
| 5,866,904 | A | *  | 2/1999  | Todokoro et al. ............. 250/310 |
| 5,969,357 | A | *  | 10/1999 | Todokoro et al. ................. 850/9 |
| 6,114,695 | A | *  | 9/2000  | Todokoro et al. ................. 850/9 |
| 6,448,556 | B1| *  | 9/2002  | Cowley et al. ................. 250/311 |
| 6,501,077 | B1|    | 12/2002 | Sawahata et al. |
| 6,646,262 | B1|    | 11/2003 | Todokoro et al. |
| 6,812,045 | B1| *  | 11/2004 | Nikoonahad et al. ........... 438/14 |
| 6,855,929 | B2| *  | 2/2005  | Kimba et al. ..................... 850/9 |
| 6,885,445 | B2| *  | 4/2005  | Bennett et al. ................. 356/301 |
| 6,946,654 | B2| *  | 9/2005  | Gerlach et al. ................... 850/3 |

(Continued)

FOREIGN PATENT DOCUMENTS

JP   56-126933   10/1981
JP   07-249393   9/1995

(Continued)

*Primary Examiner* — David A Vanore
(74) *Attorney, Agent, or Firm* — McDermott Will & Emery LLP

(57) ABSTRACT

The present invention provides a charged particle beam device in which signal electrons (14) are generated from a sample when the sample (11) is irradiated with a primary charged particle beam (3), and then enter different positions of a position-sensitive signal detector (16) in accordance with energy of the signal electrons (14), whereby an energy distribution image of the signal electrons generated from the sample is acquired. Accordingly, it becomes possible to discriminate and select signal electrons having arbitrary energy to thereby obtain an image to which information specific to the arbitrary energy is reflected, and to acquire various characteristic information of the sample.

18 Claims, 12 Drawing Sheets

U.S. PATENT DOCUMENTS

| | | | |
|---|---|---|---|
| 6,950,196 B2 * | 9/2005 | Fielden et al. | 356/630 |
| 7,019,294 B2 * | 3/2006 | Koyama et al. | 250/311 |
| 7,351,969 B2 * | 4/2008 | Watanabe et al. | 250/310 |
| 7,557,917 B1 * | 7/2009 | Beesley | 356/318 |
| 7,569,838 B2 * | 8/2009 | Watanabe et al. | 250/428 |
| 7,655,906 B2 * | 2/2010 | Cheng et al. | 250/307 |
| 7,705,302 B2 * | 4/2010 | Aoki et al. | 250/310 |
| 7,752,001 B2 * | 7/2010 | Hirai et al. | 702/95 |
| 7,881,558 B2 * | 2/2011 | Yamaguchi et al. | 382/276 |
| 7,888,642 B2 * | 2/2011 | Nakasuji et al. | 250/310 |
| 7,928,378 B2 * | 4/2011 | Kimba et al. | 250/307 |
| 8,026,491 B2 * | 9/2011 | Ogashiwa et al. | 250/396 R |
| 2007/0040118 A1 * | 2/2007 | Cheng et al. | 250/310 |
| 2008/0173814 A1 * | 7/2008 | Watanabe et al. | 250/310 |
| 2011/0233399 A1 * | 9/2011 | Ichimura et al. | 250/307 |

FOREIGN PATENT DOCUMENTS

| | | |
|---|---|---|
| JP | 10-208683 | 8/1998 |
| JP | 11-067138 | 3/1999 |
| JP | 11-096955 | 4/1999 |
| JP | 2003-208866 | 7/2003 |
| WO | WO 00/19482 | 4/2000 |
| WO | WO 01/75929 | 10/2001 |

* cited by examiner

Deflection angle to energy of secondary electrons which are deflected by EXB when sample is irradiated with primary electrons of acceleration voltage of 1 kV Trajectories of secondary electrons Portion against which electrons collide Portion against which
electrons collide Trajectories of
signal electrons Portion against which electrons collide Portion against which
electrons collide

CHARGED PARTICLE BEAM DEVICE

RELATED APPLICATIONS

This application is the U.S. National Phase under 35 U.S.C. §371 of International Application No. PCT/JP2009/005998, filed on Nov. 11, 2009, which in turn claims the benefit of Japanese Application No. 2008-306952, filed on Dec. 2, 2008, the disclosures of which Applications are incorporated by reference herein.

TECHNICAL FIELD

The present invention relates to a charged particle beam device, and more particularly, to a charged particle beam device which is preferably used for selectively discriminating and detecting signal electrons which are generated from a sample and have arbitrary energy.

BACKGROUND ART

In a charged particle beam device such as a scanning electron microscope, a sample is irradiated with a charged particle beam, and secondary electrons, backscattered electrons, and the like emitted from the irradiation position are detected.

A secondary electron image formed by detecting the secondary electrons mainly has a surface profile contrast of the sample.

A backscattered electron image formed by detecting the backscattered electrons has a composition contrast in addition to the surface profile contrast.

In a conventional scanning electron microscope, in order to discriminate and detect secondary electrons and backscattered electrons, a trajectory of electron is deflected for discrimination and detection by an energy filter including a plurality of detectors and electrodes.

Patent Document 1 discloses an electron beam apparatus which uses: electrodes opposed to each other, between which a primary electron beam is positioned and an electric field is formed; and a magnetic pole (orthogonal electromagnetic field (EXB) apparatus) for forming a magnetic field which generates a deflection operation against a deflection operation of the electric field on the primary electron beam, to deflect secondary electrons and backscattered electrons at different angles, so as to separate the secondary electrons from the backscattered electrons for detection.

Patent Document 2 discloses an electron beam apparatus which uses a porous electrode which forms an electric field for energy filtering, to thereby discriminate between secondary electrons and backscattered electrons in terms of energy for detection.

Patent Document 3 discloses an electron beam apparatus which uses a secondary electron conversion electrode which generates secondary electrons by means of collision of backscattered electrons, to thereby detect the backscattered electrons or the secondary electrons with high efficiency.

According to the technologies disclosed in these Patent Documents, it becomes possible to separate secondary electrons and backscattered electrons on different trajectories for detection or detect the two types of electrons together, on the basis of a difference in energy.

PRIOR ART DOCUMENTS

Patent Documents

Patent Document 1: JP Patent Publication (Kokai) No. 10-61897 A (1998)

Patent Document 2: JP Patent Application No. 2001-573514 A

Patent Document 3: JP Patent Application No. 2000-572892 A

SUMMARY OF INVENTION

Problems to Be Solved by the Invention

According to the technologies disclosed in the above-mentioned Patent Documents, when signal electrons are detected, the secondary electrons and the backscattered electrons are separated for detection on different trajectories or are detected together on the basis of a difference in energy of the electrons. However, a plurality of detectors and electrodes have been used to discriminate the secondary electrons and the backscattered electrons for detection, and hence a threshold value of the energy for the discrimination has been determined on the basis of structures of the detectors and the electrodes. Therefore, even when it is required that energy range is to be changed to an arbitrary range, there have been problems of restriction on the energy range and the like.

In addition, in the conventional detectors, although discrimination between signal electrons having a large difference in energy, such as the separation and detection of the secondary electrons and the backscattered electrons, has been performed, energy distributions of the secondary electrons and the backscattered electrons have not been taken into consideration. The secondary electrons and the backscattered electrons have been collectively detected respectively, and hence the energy distribution of the secondary electrons and the energy distribution of the backscattered electrons have not been acquired.

The present invention has an object to provide an electron beam apparatus in which the arrangements of detectors and the structures of electrodes are simple and electrons in an arbitrary energy range are selectively discriminated and detected. The present invention also has an object to acquire characteristics of a sample on the basis of energy distribution of signal electrons.

Means to Solve the Problems

A detector capable of identifying an incident position of signal electrons is used as a signal detector. Distribution of incident positions at which the signal electrons enter the signal detector is acquired for each irradiation position of a charged particle beam. The distribution of the incident positions corresponds to energy distribution of the signal electrons.

An energy distribution image of the signal electrons is acquired, and hence energy of signal electrons to be taken into consideration can be arbitrarily changed by image processing and the like. Because obtained information is different depending on an energy region of the signal electrons, various characteristic information of a sample can be acquired by arbitrarily selecting an energy region.

Effects of Invention

According to the present invention, signal electrons in an arbitrary energy range can be selectively discriminated. In addition, detailed characteristics of a sample can be acquired on the basis of energy distribution of the signal electrons.

DESCRIPTION OF EMBODIMENTS

Hereinafter, embodiments of the present invention are described in detail with reference to the drawings. It should be noted that, in the following embodiments, description is given using a scanning electron microscope, but the present invention can be applied to other charged particle beam device.

Figure 1:
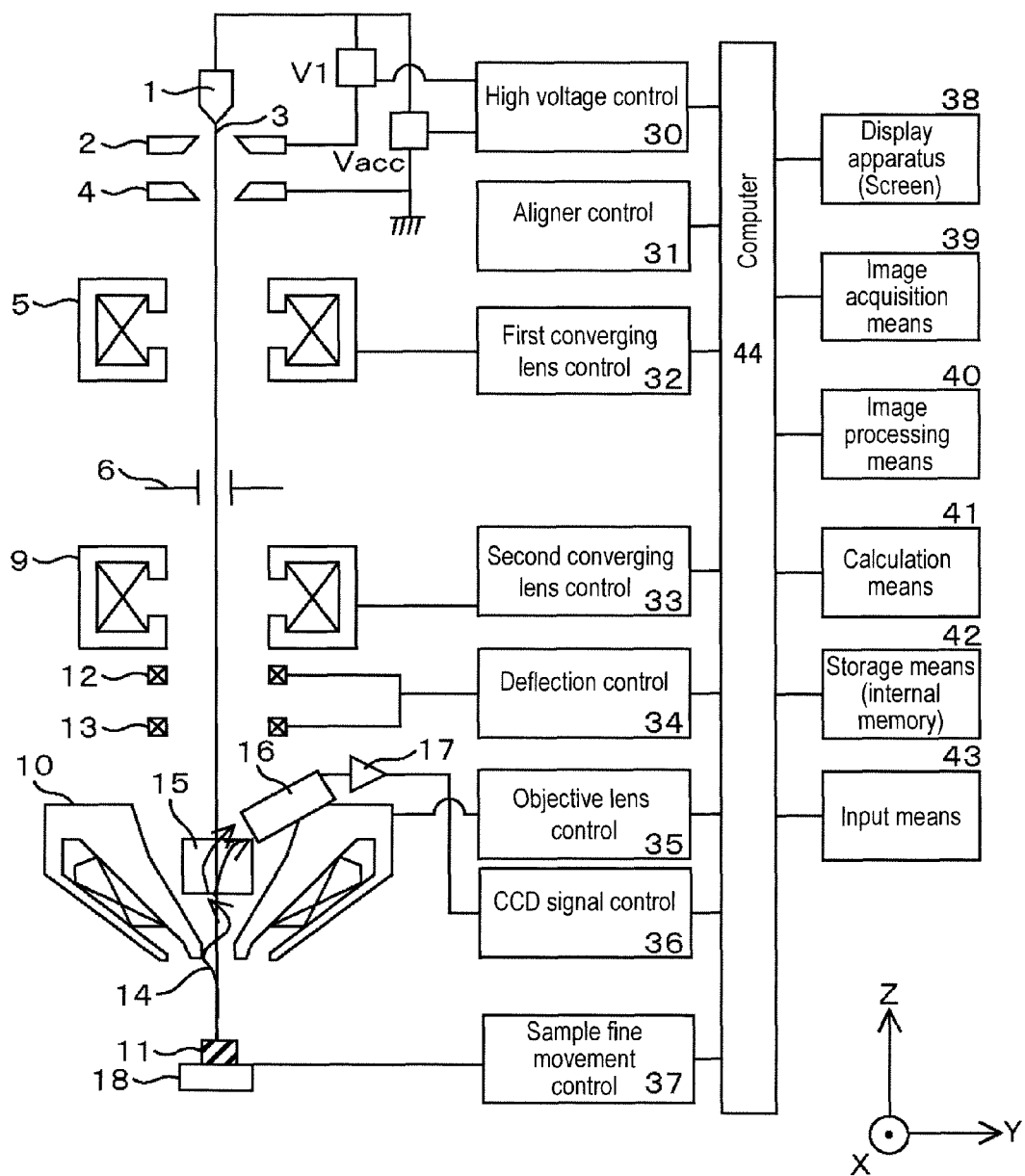
FIG. 1 is an overall configuration diagram to be described below in Description of Embodiments.

FIG. 1 is a schematic diagram of the embodiments of the present invention. A primary electron beam 3 is emitted from a cathode 1 by a voltage V1 applied to the cathode 1 and a first anode 2, and is accelerated by a voltage Vacc applied to a second cathode 4, to advance to a downstream electromagnetic lens system. The acceleration voltages Vacc and V1 are controlled by a high voltage control circuit 30. The primary electron beam 3 is converged by a first converging lens 5 which is controlled by a first converging lens control circuit 32. Here, a sample irradiation current of the primary electron beam 3 is limited by an objective lens diaphragm 6, and in order to cause the center of the electron beam to pass through the center of a hole of the objective lens diaphragm 6, there are provided: an aligner for electron beam central axis adjustment (not shown); and a deflector for electron beam center adjustment (not shown) which serves to perform scanning with the electron beam on the objective lens diaphragm 6. Further, the primary electron beam 3 is converged again by a second converging lens 9 which is controlled by a second converging lens control circuit 33, and is focused into a still thinner beam on a sample 11 by an objective lens 10 which is controlled by an objective lens control circuit 35. Then, the electron beam two-dimensionally scans the sample 11 by means of an upstream deflection coil 12 and a downstream deflection coil 13 to which a deflection control circuit 34 is connected.

Signal electrons 14 having energy which is larger than 0 eV and equal to or lower than energy of primary electrons are emitted from a primary electron beam irradiation point on the sample 11. The signal electrons 14 are detected by a detector 16 and are amplified by an amplifier 17, while a deflector 15 placed in an upper part of the objective lens prevents axis deviation of the primary electron beam 3.

The detector 16 is controlled by a CCD controller 36. Various control circuits 30 to 37 including the CCD controller 36 are controlled by a computer 44 which controls the entire apparatus. A signal of the amplified electrons is displayed as an enlarged image of the sample on a screen of a display apparatus 38. The computer 44 is also connected to: the display apparatus 38; image acquisition means 39 for acquiring, as image information, the observation picture displayed on the display apparatus 38; image processing means 40; calculation means 41 for performing various calculations on such an observation image; an internal memory 42 for storing the observation image and the calculation result; and input means 43 for inputting observation conditions and the like. It should be noted that the display apparatus can also display a detection location of the detected electrons.

Figure 2:
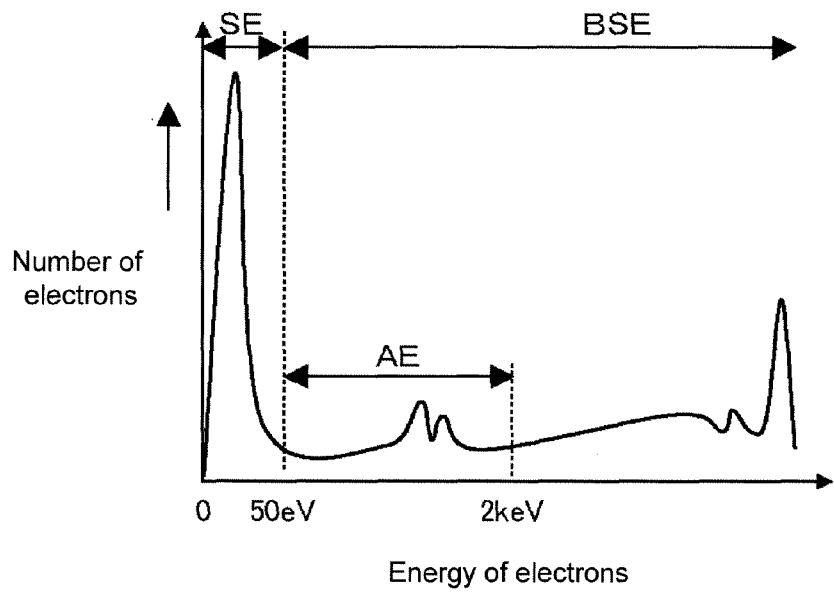
FIG. 2 is a diagram showing a relation between energy of emission electrons and the number of the electrons.

FIG. 2 is a diagram showing a relation between energy of electrons and the number of the electrons emitted when the sample is irradiated with primary electrons. In accordance with the energy, the emitted electrons refer to as secondary electrons (SE), backscattered electrons (BSE), Auger electrons (AE), inelastic scattering electrons, or elastic scattering electrons.

Figure 3:
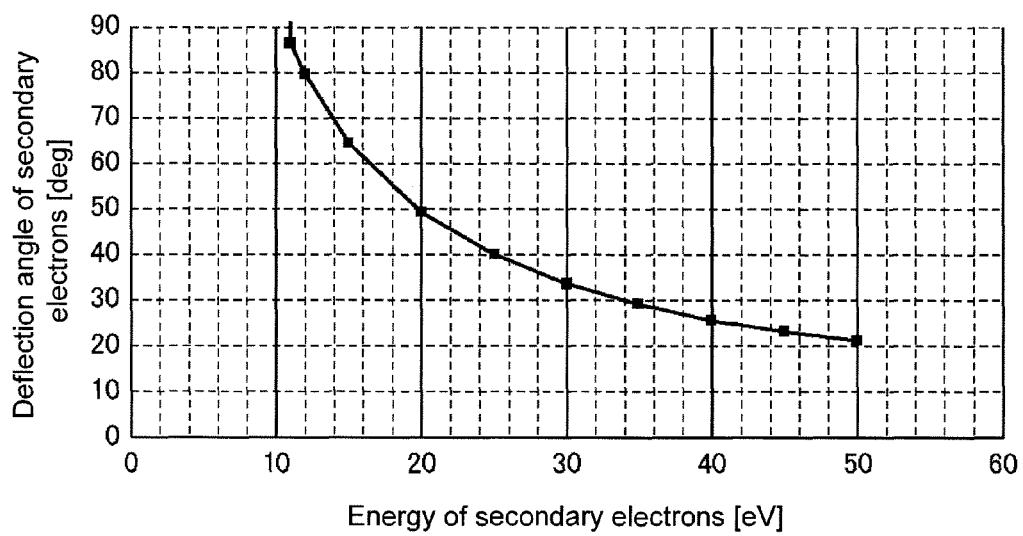
FIG. 3 is a diagram for describing a deflection angle of secondary electrons.

FIG. 3 shows a relation between energy of secondary electrons which have entered the deflector 15 and a deflection angle thereof. The deflector 15 is an apparatus disclosed in Patent Document 1.

Inside of the deflector 15, secondary electrons having lower energy are deflected at a wide angle, and as the energy becomes higher, the deflection angle becomes smaller. In the present embodiment, description is given of the case where the signal electrons are the secondary electrons. However, the signal electrons may be any particles having a negative charge, such as backscattered electrons, Auger electrons, inelastic scattering electrons, and elastic scattering electrons, and the deflection angle is different depending on the energy of the particles inside of an orthogonal electromagnetic field (EXB) apparatus. This relation is not particularly limited to the secondary electrons. In addition, in the present embodiment, description is given of the case where the orthogonal electromagnetic field (EXB) apparatus is used, but as long as the condition that signal electrons having different energies are detected at different detection positions is satisfied, other deflector may be used, and the deflector may not be used.

Figure 7:
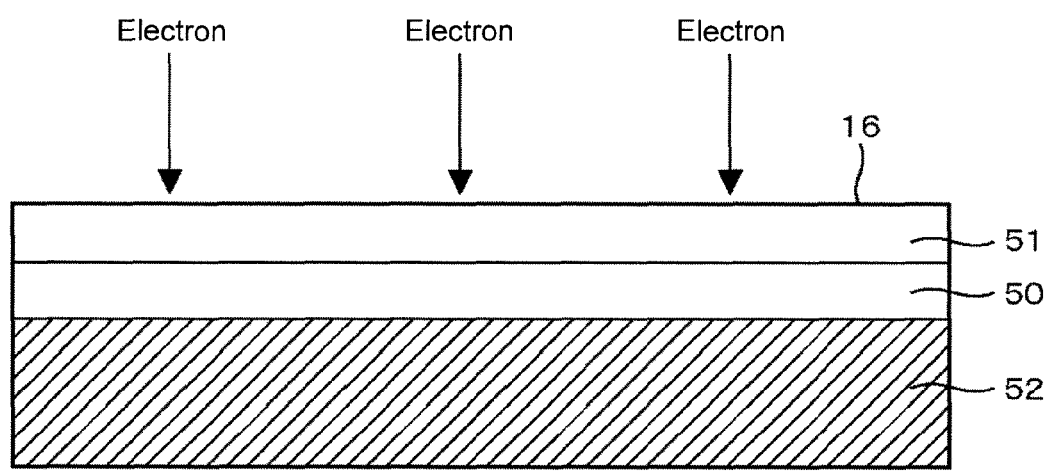
FIG. 7 is a view schematically illustrating a structure of a detector.

FIG. 7 is a schematic view of a structure of a detector including a CCD which is one embodiment of the detector 16.

A CCD 52 is attached to a front surface of the detector 16. In addition, a scintillator 50 is fixed to the CCD 52 via an acceleration electrode 51. When electrons enter the acceleration electrode 51, the electrons are accelerated while holding positions at which the electrons reach the detector, and collide against the scintillator 50, so that a light emission pattern is generated. This pattern is detected by the CCD 52.

The size of the detector 16 including the CCD is large enough to take in signal electrons having different energies even when the signal electrons are deflected at different angles, and the size thereof is not particularly limited as long as the size is equal to or larger than 3 mm The number of pixels of an image of the CCD 52 is not particularly limited as long as the signal electrons having different energies can be discriminated and the image can be taken in.

The number of pixels of an image which can be taken in by the CCD is approximately 1,500 to 1,700 in width and 1,000 to 1,200 in length.

With the adoption of the structure of the signal electron detector 11 as illustrated in FIG. 7, the size is approximately 40 mm in width, 30 mm in length, and 5 to 10 mm in thickness, and hence it is possible to mount the detector. In a conventional detector including a CCD, the size of the CCD is approximately 6 and hence light generated from a scintillator enters a plurality of CCD detection elements, so that the light needs to be converged by a lens. Therefore, the light generated from the scintillator is converged by the lens placed between the scintillator and the CCD, and then is caused to enter the CCD. Accordingly, the conventional detector including the CCD has a large size, and hence it is not possible to mount the detector.

The present invention adopts the structure in which: the size of the CCD detection element is set to 20 μm which is larger than the conventional size; and light emitted from the scintillator 50 is detected without being converged by a lens.

In addition, the thickness of the scintillator is determined in relation to the size of the CCD detection element. This is because, if the scintillator is extremely thick, light which has spread inside of the scintillator enters a plurality of the CCD detection elements, which deteriorates the accuracy of an incident position. An element with 10 bits or more is used as the CCD detection element.

With regard to the arrangement of the detector, the detector is placed at the same position as that of a conventional secondary electron detector, but the placement location thereof is not limited as long as the detector is placed so that signal electrons having different energies are detected at different detection positions.

With the detector as described above, an arbitrary energy range of electrons constituting an image can be selected by selecting a region to be counted on the detector. Accordingly, since information of these electrons can be selected, it is possible to obtain an image to which characteristics of the detected electrons are reflected, such as a composition contrast image and an irregularity contrast image.

For example, if an energy region of secondary electrons is selected, irregularity information of a sample surface can be obtained. Composition information of a sample can be obtained from backscattered electrons which are scattered at a high angle, and crystal orientation information of the sample can be obtained from backscattered electrons which are reflected at a low angle. If an energy region of Auger electrons having energy higher than that of secondary electrons is selected, composition information of a sample surface can be obtained. Inelastic scattering electrons have lost energy which depends on an atomic binding state of a sample surface, and have band structure information of the surface.

Hereinafter, a plurality of embodiments are described.

Embodiment 1

Description is given of an example of the case where the present invention is applied to observation of a charged sample, with the use of the apparatus configuration described above.

Figure 4:
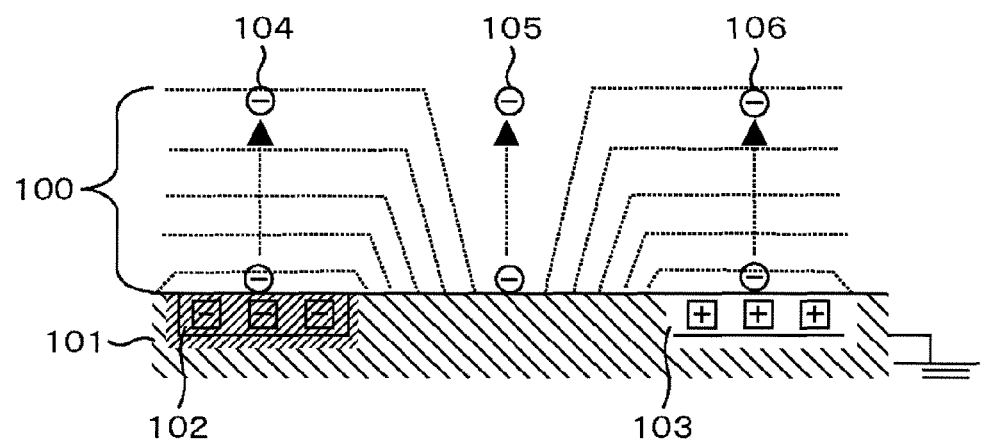
FIG. 4 is a cross sectional view of the vicinity of a surface of a charged sample.

FIG. 4 is a cross sectional view of the vicinity of a surface of a charged sample 101. The charged sample 101 includes a negatively-charged portion 102 and a positively-charged portion 103, and an electric field expressed by an equipotential line 100 is generated by charging. Secondary electrons 104 generated from the negatively-charged portion 102 and secondary electrons 106 generated from the positively-charged portion 103 are each subjected to the force from the electric field.

Figure 5:
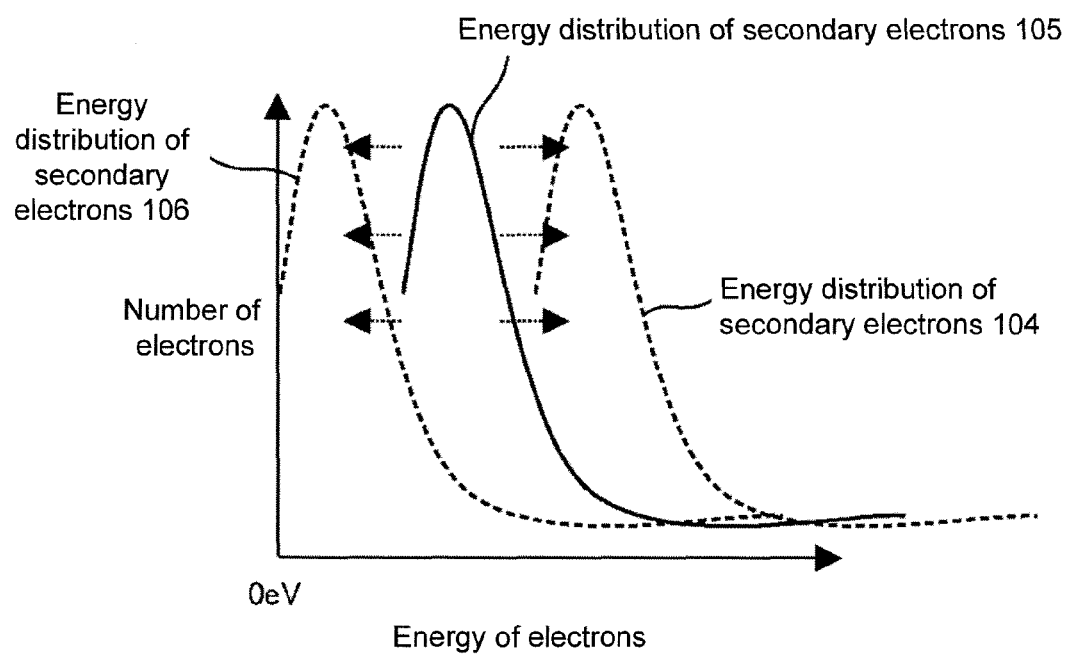
FIG. 5 is a diagram showing a relation between energy of secondary electrons and the number of the electrons in FIG. 3.

FIG. 5 shows a relation between energy of the secondary electrons 104, 105, and 106 illustrated in FIG. 4 and the number thereof. The secondary electrons 104 generated from the negatively-charged portion 102 are subjected to the force from the electric field and thus have higher energy, and energy distribution of the secondary electrons 104 shifts to a higher side. The secondary electrons 106 generated from the positively-charged portion 103 are subjected to the force from the electric field and thus have lower energy, and energy distribution of the secondary electrons 106 shifts to a lower side.

Figure 6:
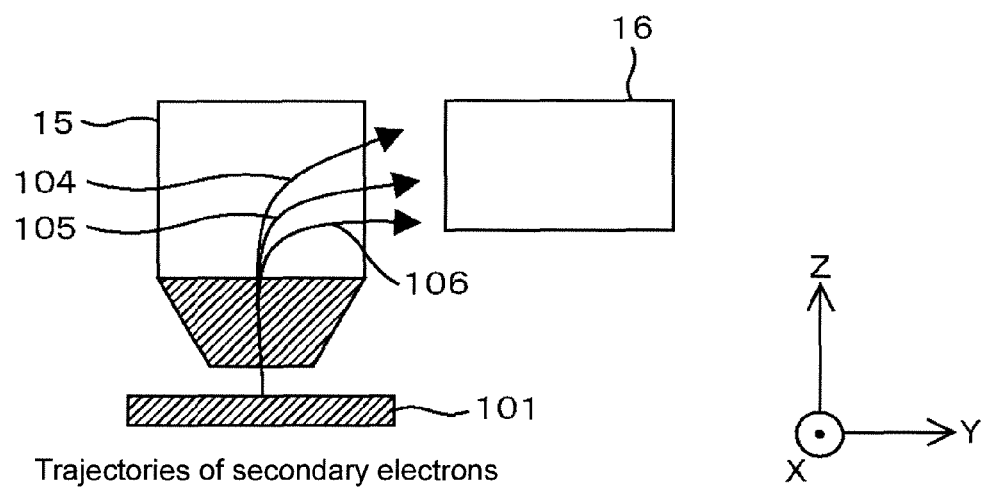
FIG. 6 is a view for describing trajectories of the secondary electrons.

FIG. 6 illustrates trajectories of the secondary electrons emitted from the sample. The energy of the secondary electrons is several tens of eV, and when an electric field of approximately 1 V/mm is applied to the deflector 15, to generate a magnetic field by which the primary electron beam is not deflected, the secondary electrons 104, 105, and 106 illustrated in FIG. 3 are deflected by the deflector 15 (in the present embodiment, an orthogonal electromagnetic field (EXB) apparatus is used). Then, according to the relation shown in FIG. 3, the secondary electrons 104 collide against an upper part of the detector 16, the secondary electrons 105 collide against the center of the detector 16, and the secondary electrons 106 collide against a lower part of the detector 16. It should be noted that, in the present embodiment, the secondary electrons are used as the signal electrons, but other electrons can also be used.

Figure 8:
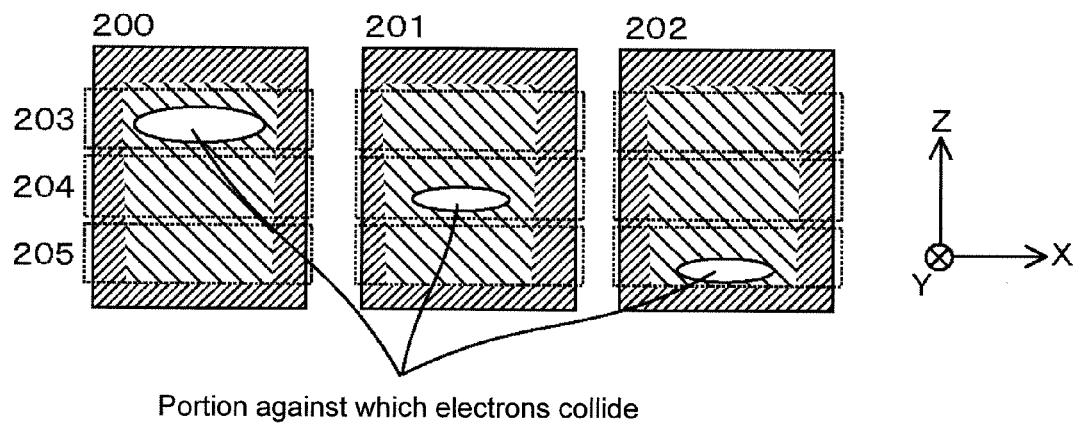
FIG. 8 is a view for describing light emission patterns which are made on a scintillator by the electrons.

FIG. 8 illustrates light emission patterns which are made on the scintillator by the secondary electrons 104, 105, and 106 illustrated in FIG. 6, when the detector 16 is observed from the deflector 15. The upper direction of the scintillator corresponds to the upper direction of the detector. The secondary electrons 104 having higher energy form a light emission pattern 200, and the upper part of the scintillator emits light. The secondary electrons 105 having lower energy form a light emission pattern 201, and the center of the scintillator emits light. The secondary electrons 106 having still lower energy form a light emission pattern 202, and the lower part of the scintillator emits light.

Figure 9:
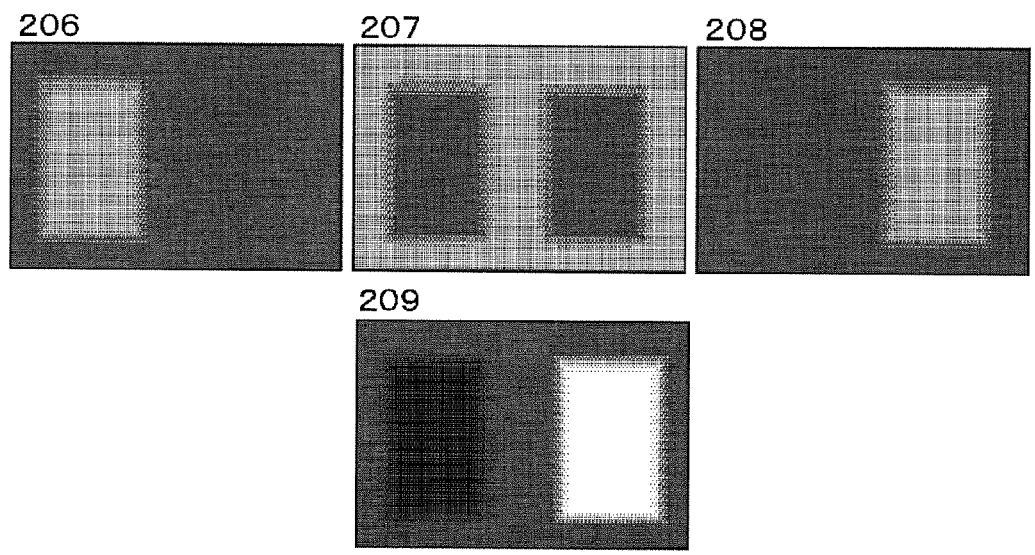
FIG. 9 is a view for describing images formed by detected electron signals.

FIG. 9 illustrates sample images formed by detected electron signals. An image 206 is an image formed by an electron signal which collides against an upper part 203 of the scintillator. Secondary electrons having higher energy are detected in the upper part of the scintillator. On an image formed by the secondary electrons having higher energy, a negatively-charged portion is bright, and the other portion is dark.

Similarly, an image 207 is an image formed by an electron signal which collides against a center 204 of the scintillator. Secondary electrons having lower energy are detected in the center of the scintillator. On an image formed by the secondary electrons having lower energy, an uncharged portion is bright, and the other portion is dark.

An image 208 is an image formed by an electron signal which collides against a lower part 205 of the scintillator.

Secondary electrons having still lower energy are detected in the lower part of the pattern. On an image formed by the secondary electrons having still lower energy, a positively-charged portion is bright, and the other portion is dark.

According to such a configuration, it is possible to distinguish and detect electrons which cannot be distinguished conventionally, so that information of a charged portion of the sample can be obtained.

In addition, in the case where the deflector 15 is set to the above-mentioned condition (the electric field of approximately 1 V/mm is applied, to generate a magnetic field by which the primary electron beam is not deflected), the signal electrons which collide against the upper part of the scintillator are electrons emitted from the negatively-charged region, and a contrast formed by these electrons is expressed by black. The electrons which collide against the center of the scintillator are electrons emitted from the uncharged region, and a contrast formed by these electrons is expressed by gray. The electrons which collide against the lower part of the scintillator are electrons emitted from the positively-charged region, and a contrast formed by these electrons is expressed by white. In this way, by associating a region of each pattern on the scintillator with a charging voltage, and associating a contrast of an image with the region of the scintillator, it is possible to associate the charging voltage with the contrast of the image, and hence a charging contrast image 209 can be obtained. According to such a configuration, it is possible to distinguish and detect electrons which cannot have been associated with the charging voltage and cannot have been distinguished conventionally, so that the charging contrast image of the sample can be obtained.

It should be noted that an energy region to be selected can be determined in advance as a numerical value, or can be decided by checking a distribution image. This method of selecting the energy region can be applied similarly to the following embodiments.

Embodiment 2

In the present embodiment, description is given of an example of the case where the present invention is applied to observation of a structure of an outermost surface of a base material sample including heavy-metal fine particles.

Figure 10:
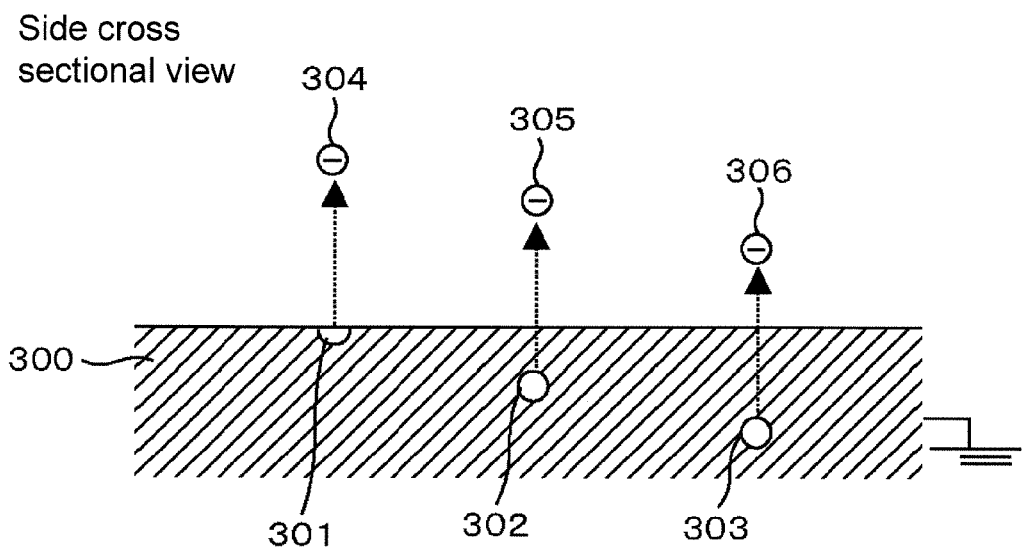
FIG. 10 is a side cross sectional view of a base material sample including heavy-metal fine particles.

FIG. 10 is a side cross sectional view of the vicinity of a surface of a base material sample 300 including heavy-metal fine particles. A heavy-metal fine particle 301 exists on the surface of the sample 300. A heavy-metal fine particle 302 exists inside of the sample 300. A heavy-metal fine particle 303 exists at a position deeper than that of the heavy-metal fine particle 302 from the surface of the sample 300.

Figure 11:
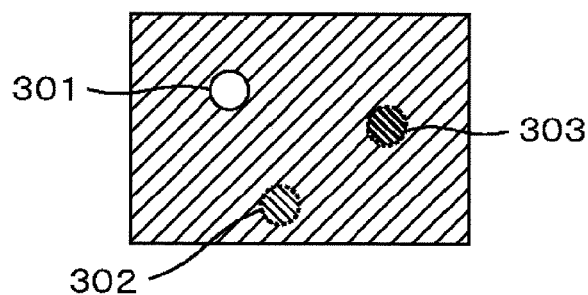
FIG. 11 is an overhead view of the base material sample including the heavy-metal fine particles.

FIG. 11 is an overhead view of the surface of the base material sample 300 including the heavy-metal fine particles.

Figure 12:
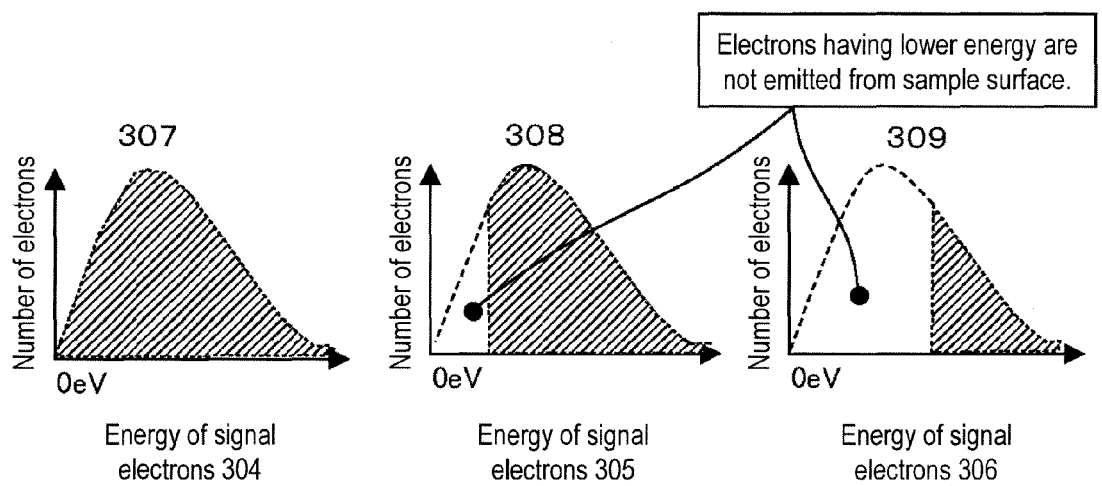
FIG. 12 is a diagram for describing relations between energy of electrons and the number of the electrons illustrated in FIG. 10.

FIG. 12 shows relations between energy of signal electrons 304, 305, and 306 illustrated in FIG. 10 and the number thereof. All the signal electrons 304 generated from the heavy-metal fine particle 301 existing on the sample surface is emitted above the sample. Accordingly, the signal electrons 304 have gray energy distribution shown in a relation 307 between the energy of the secondary electrons and the number of the electrons.

The signal electrons 305 generated from the heavy-metal fine particle 302 existing on the sample surface lose energy before being emitted from the sample surface, while repeating collisions against sample atoms, so that electrons having lower energy are not emitted above the sample. Accordingly, the signal electrons 305 have gray energy distribution shown in a relation 308 between the energy of the secondary electrons and the number of the electrons.

The signal electrons 306 generated from the heavy-metal fine particle 303 existing on the sample surface lose energy before being emitted from the sample surface, while repeating collisions against sample atoms, so that only electrons having higher energy are emitted above the sample. Accordingly, the signal electrons 306 have gray energy distribution shown in a relation 309 between the energy of the secondary electrons and the number of the electrons.

Figure 13:
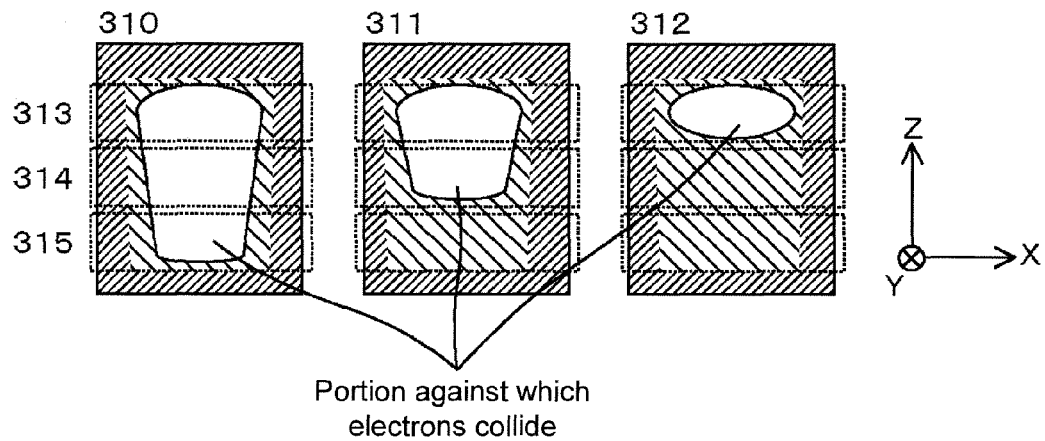
FIG. 13 is a view for describing light emission patterns which are made on the scintillator by the electrons.

FIG. 13 illustrates light emission patterns which are made on the scintillator by the signal electrons 304, 305, and 306 illustrated in FIG. 10, when the detector 16 is observed from the deflector 15. The upper direction of the scintillator corresponds to the upper direction of the detector. The signal electrons 304 form a light emission pattern 310, and the scintillator emits light all around. The signal electrons 305 having a low rate of lower energy electrons form a light emission pattern 311, and a portion of the scintillator between the center and the upper part emits light. The signal electrons 306 having a high rate of higher energy electrons form a light emission pattern 312, and the upper part of the scintillator emits light.

Accordingly, the light emission pattern on the scintillator varies depending on the depth of the heavy-metal particles, and when the heavy-metal fine particle 301 existing on the sample surface is irradiated with the primary electron beam, the light emission pattern 310 can be observed. When the heavy-metal fine particle 302 existing inside of the sample is irradiated with the primary electron beam, the light emission pattern 311 can be observed. When the heavy-metal fine particle 303 existing at a position deeper than that of the heavy-metal fine particle 302 from the sample surface is irradiated with the primary electron beam, the light emission pattern 312 can be observed.

Figure 14:
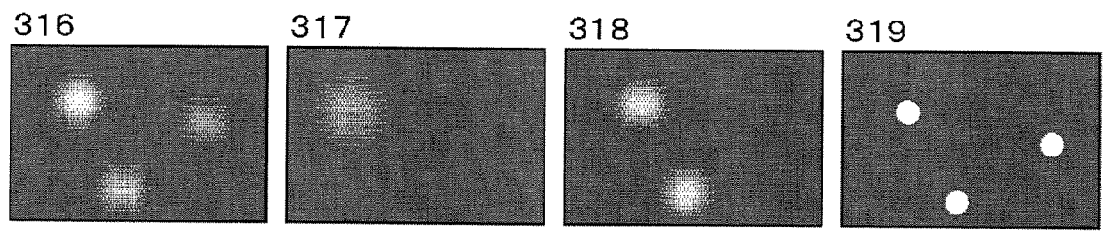
FIG. 14 is a view for describing images formed by detected electron signals.

FIG. 14 illustrates images formed by detected electron signals. An image of signal electrons 316 is an image detected by a conventional detector.

An image of signal electrons 317 is an image formed by summing outputs of a lower part 315 of the scintillator. Electrons having lower energy collide against the lower part of the scintillator, and hence secondary electrons generated inside of the sample are not emitted from the sample surface, so that secondary electrons generated on the sample surface are detected. That is, the signal electrons 317 have information of the heavy-metal fine particle existing on the sample surface.

An image of signal electrons 318 is an image formed by summing outputs of a center 314 of the scintillator. Secondary electrons having higher energy collide against the center of the scintillator, and hence secondary electrons generated inside of the sample are detected. That is, the signal electrons 318 have information of the heavy-metal fine particle existing inside of the sample.

An image of signal electrons 319 is an image formed of an electron signal by summing outputs of an upper part of the scintillator. Secondary electrons having higher energy collide against the upper part of the scintillator, and hence secondary electrons generated at a deep position from the sample surface are detected. That is, the signal electrons 319 have information of the heavy-metal fine particle existing at a position deeper than that of the heavy-metal fine particle 302 from the sample surface.

According to such a configuration, it is possible to obtain an image with a different contrast depending on a difference in depth within a sample, so that the depth of a target element within the sample can be acquired.

Embodiment 3

In the present embodiment, description is given of an example of the case where the present invention is applied to observation of a structure of a surface of a sample having an irregularity.

Figure 15:
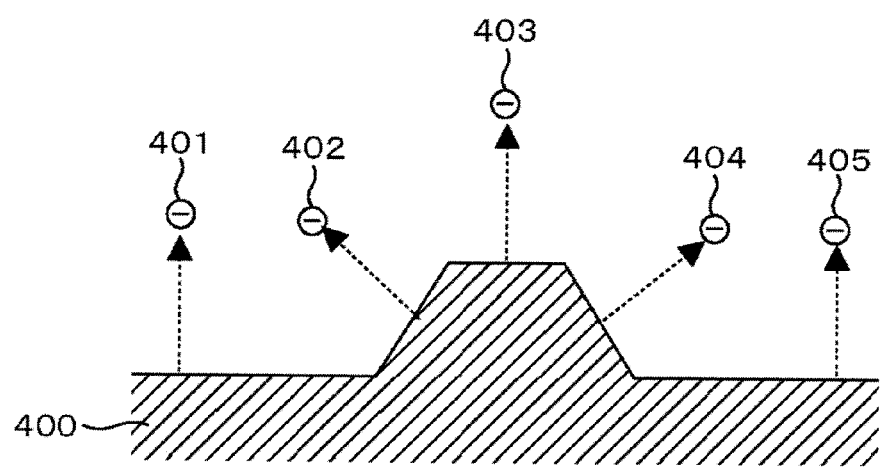
FIG. 15 is a cross sectional view of a sample having an irregularity.

FIG. 15 is a cross sectional view of the vicinity of a surface of a sample 400 having an irregularity. When the sample is irradiated with primary electrons, signal electrons are generated from an irradiation position with the primary electrons. The generation direction of secondary electrons generally follows the cosine law, and secondary electrons are more likely to have a velocity perpendicular to the sample surface. That is, signal electrons 402 generated from a portion inclined to the left are more likely to have a velocity inclined to the left with respect to the direction of electrons generated from an uninclined portion. In addition, signal electrons 404 generated from a portion inclined to the right are more likely to have a velocity inclined to the right with respect to the direction of electrons generated from an uninclined portion.

Figure 16:
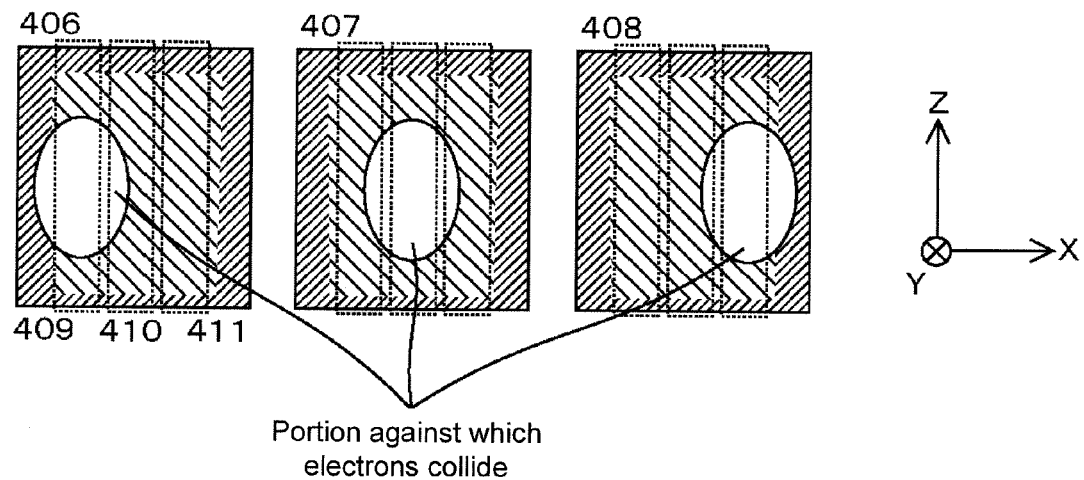
FIG. 16 is a view for describing patterns which are made on the scintillator by the electrons.

FIG. 16 illustrates light emission patterns which are made on the scintillator by the signal electrons 401, 402, 403, 404, and 405 illustrated in FIG. 15, when the detector 16 is observed from the deflector 15. The upper direction of the pattern corresponds to the upper direction of the detector. The signal electrons 402 which are more likely to have the velocity inclined to the left form a light emission pattern 406, and the left part of the scintillator emits light. The signal electrons 401, 403, and 405 which are less likely to have the velocity inclined to the left or right form a light emission pattern 407, and the center of the scintillator emits light. The signal electrons 404 which are more likely to have the velocity inclined to the right form a light emission pattern 408, and the right part of the scintillator emits light.

Figure 17:
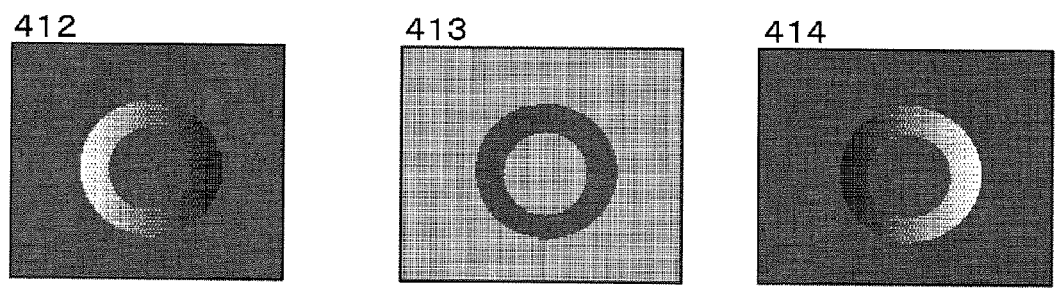
FIG. 17 is a view for describing images formed by detected electron signals.

FIG. 17 illustrates images formed by detected electron signals. An image 412 is an image formed by signal electrons which collide against a left part 409 of the scintillator. An image 413 is an image formed by an electron signal which collides against a center 410 of the scintillator. An image 414 is an image formed by an electron signal which collides against a right part 411 of the scintillator. According to such a configuration, it is possible to obtain a contrast image and a stereoscope image of a still finer sample in an irregularity inclination direction.

Embodiment 4

In the present embodiment, description is given of an example of the case where the present invention is applied to observation of a structure of an outermost surface of a metal alloy sample.

Figure 18:
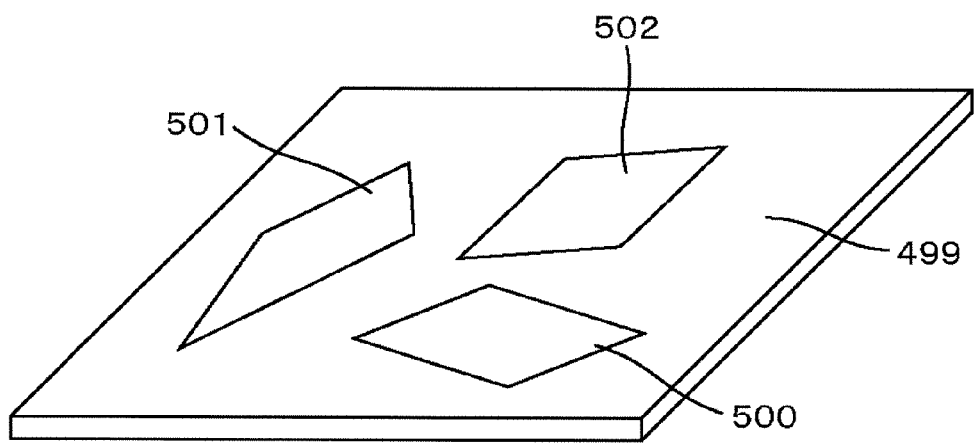
FIG. 18 is a view for describing a metal alloy sample.

FIG. 18 illustrates a metal alloy sample 499. In the metal alloy sample 499, Au 500, Nb 501, and Mo 502 are mixedly contained.

Figure 19:
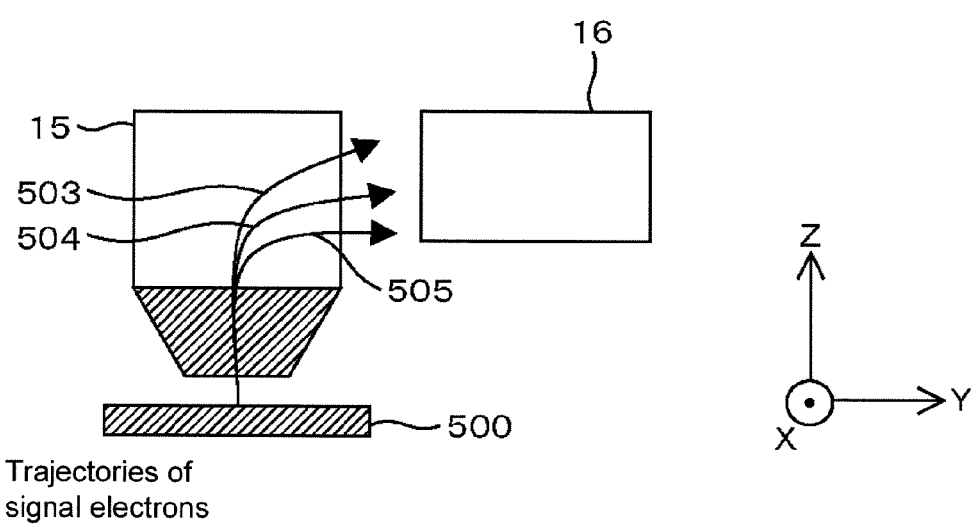
FIG. 19 is a view for describing trajectories of Auger electrons.

FIG. 19 illustrates trajectories of Auger electrons emitted from the sample. The energy of the Auger electrons is several hundreds of eV, and when an electric field of approximately 50 V/mm is applied to the deflector 15, to generate a magnetic field by which primary electrons are not deflected, Auger electrons 503, 504, and 505 respectively emitted from Au, Mo, and Nb illustrated in FIG. 17 are deflected by the deflector 15. Then, the electrons 503 collide against the upper part of the detector 16, the electrons 504 collide against the center of the detector 16, and the electrons 505 collide against the lower part of the detector 16.

Figure 20:
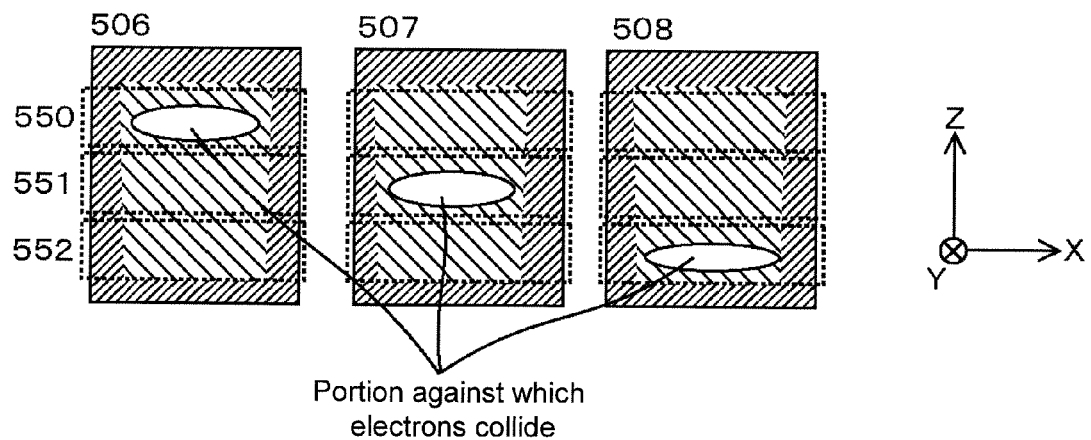
FIG. 20 is a view for describing light emission patterns which are made on the scintillator by the electrons.

FIG. 20 illustrates light emission patterns which are made on the scintillator by the Auger electrons 503, 504, and 505, when the detector 16 is observed from the deflector 15. The upper direction of the pattern corresponds to the upper direction of the detector. The Auger electrons 503 from Au form a light emission pattern 506, and the upper part of the scintillator emits light. The Auger electrons 504 from Mo form a light emission pattern 507, and the center of the scintillator emits light. The Auger electrons 505 from Nb form a light emission pattern 508, and the lower part of the scintillator emits light.

Figure 21:
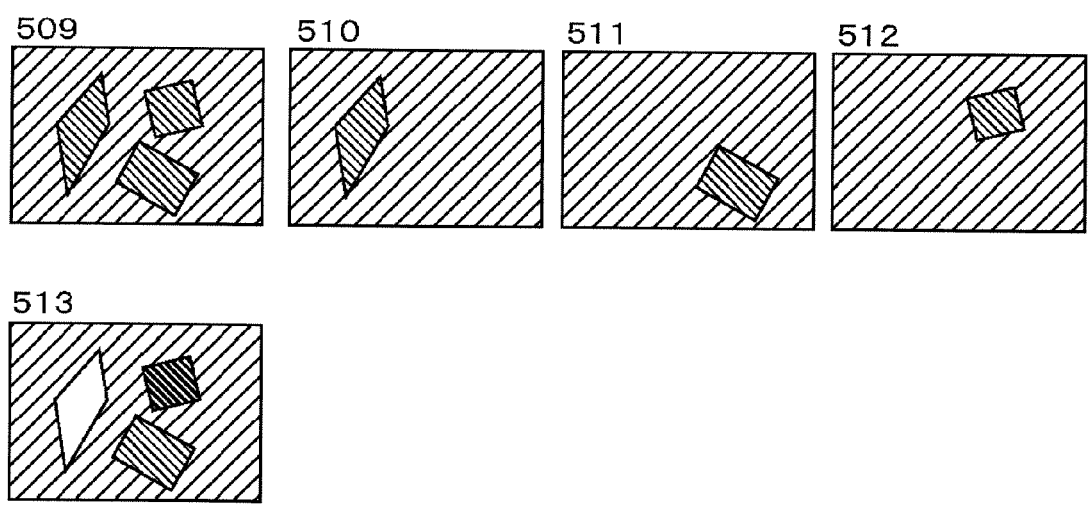
FIG. 21 is a view for describing images formed by detected electron signals.

FIG. 21 illustrates images formed by detected electron signals. An image 509 is an image formed by detected secondary electrons at the time of irradiation with primary electrons. An image 510 is an image formed by an electron signal which collides against an upper part 550 of the scintillator. An image 511 is an image formed by an electron signal which collides against a center 551 of the scintillator. An image 512 is an image formed by an electron signal which collides against a lower part 552 of the scintillator. According to such a configuration, it is possible to obtain, as a contrast of composition information, information as to where in the sample a target element exists.

In addition, in the case where the deflector 15 is set to the above-mentioned condition (the electric field of approximately 50 V/mm is applied, to generate a magnetic field by which the primary electron beam is not deflected), the signal electrons which collide against the upper part of the scintillator are Auger electrons having energy of Au, and a contrast formed by these electrons is expressed by white. The electrons which collide against the center of the scintillator are Auger electrons having energy of Mo, and a contrast formed by these electrons is expressed by gray. The electrons which collide against the lower part of the scintillator are Auger electrons having energy of Nb, and a contrast formed by these electrons is expressed by black. In this way, by associating a region of each pattern on the scintillator with the energy of the Auger electrons, and associating a contrast of an image with the region of the scintillator, it is possible to associate such electrons with the contrast of the composition, and hence a composition image 513 can be obtained.

In the present embodiment, description is given of the observation example in which the metal alloy including Au, Mo, and Nb is used as the sample, but the sample is not particularly limited as long as the sample is an element which emits Auger electrons. According to such a configuration, the use of the Auger electrons makes it possible to obtain a contrast image of composition information of the sample.

Embodiment 5

In the present embodiment, description is given of an example of the case where the present invention is applied when a charged-up portion occurs in the deflector.

Figure 22:
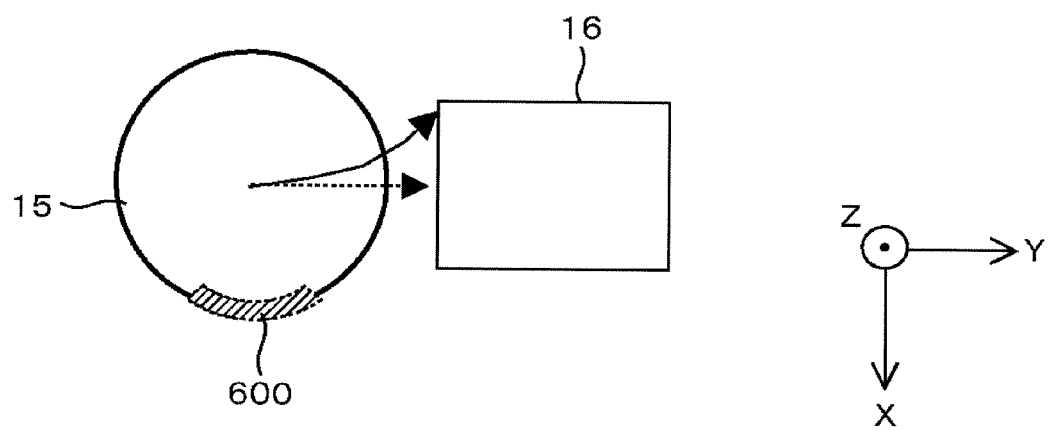
FIG. 22 is a view for describing a peripheral part of a deflector 15.

FIG. 22 is an overhead view when a peripheral part of the deflector 15 is observed in a direction in which the sample 11 is observed from the cathode 1 side. The deflector 15 includes a charged portion 600. At this time, signal electrons are subjected to the force from the charged portion, and accordingly a trajectory thereof bends, so that the signal electrons may collide against an edge of the scintillator or may miss the scintillator altogether.

Figure 23:
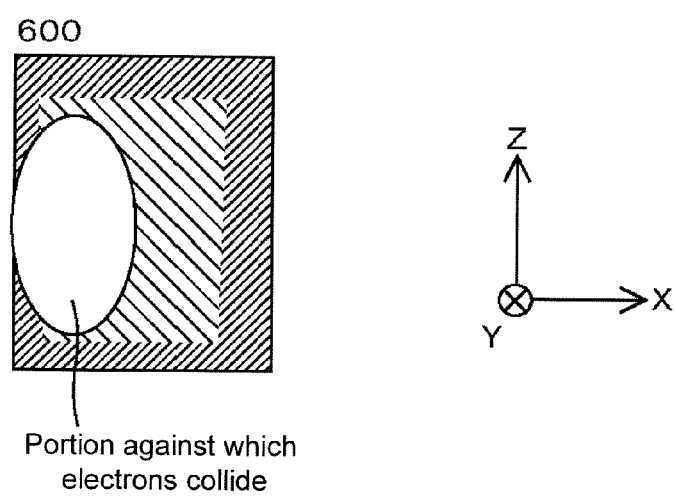
FIG. 23 is a view for describing a light emission pattern which is made on the scintillator by the electrons.

FIG. 23 illustrates a pattern which is made on the scintillator by the signal electrons, when the detector 16 is observed from the deflector 15. The upper direction of the pattern corresponds to the upper direction of the detector, and the left direction of the pattern corresponds to the direction from the front to the back of the paper sheet in FIG. 1. A pattern 601 is a pattern on the scintillator when signal electrons are deflected by an electric field generated by the charged portion 600. In this case, the signal electrons collide against not the center of the scintillator but an edge of the scintillator. A conventional detector fails to receive the signal electrons in such a case, and hence it is difficult to pursue the cause of the deflection of the signal electrons. On the other hand, the use of the detector including the CCD makes it possible to measure a deflection amount of the signal electrons, so that the charged portion which becomes problematic can be easily estimated.

Whether or not a charged-up portion occurs in the deflector can be determined by, for example, irradiating an uncharged flat sample with an electron beam and making in advance such setting that the center of distribution of detected secondary electrons is located in the center of the detector. If a charged-up portion occurs in the deflector, when a similar sample is used, the charging-up can be determined by the fact that the center of distribution of secondary electrons is not located in the center of the detector. It should be noted that which portion of the deflector is charged can be acquired by observing a distribution image.

In addition, deviation in a geometric structure of an apparatus and a magnetic field within the apparatus can be exemplified as factors which influence trajectories of signal electrons, and the detector 16 is used as means for pursuing the cause of the deflection of the signal electrons, whereby the factors which influence the trajectories of the signal electrons can be estimated more easily.

LIST OF REFERENCE SYMBOLS

1 cathode
2 first anode
3 primary electron beam
4 second cathode
5 first converging lens
6 objective lens diaphragm
7 aligner for electron beam central axis adjustment
8 deflector for electron beam center adjustment
9 second converging lens
10 objective lens
11 sample
12 upstream deflection coil
13 downstream deflection coil
14, 304, 305, 306, 316, 317, 318, 319, 401, 402, 403, 404, 405 signal electron
15 deflector
16 detector
17 amplifier
30 high voltage control circuit
31 aligner control circuit
32 first converging lens control circuit
33 second converging lens control circuit
34 deflection control circuit
35 objective lens control circuit
36 CCD controller
37 sample fine movement control circuit
38 display apparatus
39 image acquisition means
40 image processing means
41 calculation means
42 internal memory
43 input means
44 computer
50 scintillator
51 acceleration electrode
52 CCD
100 equipotential line
101 charged sample
102 negatively-charged portion
103 positively-charged portion
104, 105, 106 secondary electron
200, 201, 202, 310, 311, 312, 406, 407, 408, 506, 507, 508 light emission pattern on scintillator
203, 313, 550 upper part of scintillator
204, 314, 410, 551 center of scintillator
205, 315, 552 lower part of scintillator
206, 207, 208, 412, 413, 414 secondary electron image
209 charging contrast image
300 base material sample including heavy-metal fine particles
301, 302, 303 heavy-metal fine particle
307, 308, 309 relation graph between energy of electrons and the number of electrons
400 sample having irregularity
409 left part of scintillator
411 right part of scintillator
500 Au
501 Nb
502 Mo
503, 504, 505 Auger electron
509, 510, 511, 512 Auger electron image
513 composition image
600 charged portion
601 pattern on scintillator

The invention claimed is:

1. A charged particle beam device, comprising:
   a charged particle source;
   a deflector which scans a sample with a primary charged particle beam emitted from the charged particle source;
   an objective lens which converges the primary charged particle beam emitted from the charged particle source;
   a detector which detects at least secondary electrons which are generated from the sample by irradiation with the primary charged particle beam;
   a memory which stores a detection signal from the detector; and
   a control apparatus which processes the detection signal, wherein:
   the detector is a charge coupled device (CCD) which includes detection elements arranged in a planar manner;
   the detection elements are configured for discriminating and detecting electrons having energy differences which are generated from a primary electron beam irradiation point of the sample;
   the detector detects, for each irradiation position on the sample, distribution information of the secondary electrons emitted from the irradiation position;
   the memory stores the irradiation position and the distribution information of the signal electrons emitted from the irradiation position in association with each other; and
   the control apparatus configured to calculate a pixel value for each irradiation position on a basis of the stored distribution information of the signal electrons for each irradiation position, and to form an image by associating the calculated pixel value with each irradiation position.

2. The charged particle beam device according to claim 1, further comprising:
   a display apparatus which displays thereon a detection location of the detected secondary electrons.

3. The charged particle beam device according to claim 1, wherein the control apparatus is further configured to:
   compare distribution information of secondary electrons for each irradiation position with each other, and
   acquire charging information of the sample on a basis of the compared distribution information.

4. The charged particle beam device according to claim 1, wherein the control apparatus is further configured to:
  compare distribution information of secondary electrons for each irradiation position with each other, and
  acquire depth information from a sample surface regarding an element contained in the sample on a basis of the compared distribution information.

5. The charged particle beam device according to claim 1, wherein:
  the detector discriminates and detects secondary electrons generated in different directions from a sample surface; and
  the control apparatus is further configured to:
    compare the distribution information of the secondary electrons for each irradiation position with each other, and
    acquire profile information of the sample on a basis of the compared distribution information.

6. The charged particle beam device according to claim 1, wherein:
  the detector discriminates and detects Auger electrons emitted from different elements; and
  the control apparatus is further configured to:
    compare distribution information of Auger electrons for each irradiation position with each other, and
    identify an element contained in the sample on a basis of the compared distribution information.

7. A charged particle beam device comprising:
  a charged particle source;
  a deflector which scans a sample with a primary charged particle beam emitted from the charged particle source;
  an objective lens which converges the primary charged particle beam emitted from the charged particle source;
  a detector which detects at least secondary electrons which are generated from a sample by irradiation with the primary charged particle beam;
  a memory which stores a detection signal from the detector; and
  a control apparatus which processes the detection signal, wherein:
    the detector includes detection elements arranged in a planar manner;
    the deflector deflects the secondary electrons having energy differences that are generated from a primary electron beam irradiation point of the sample toward the detector at deflection angles depending on the energy differences;
    the detector detects, for each irradiation position on the sample, distribution information of the secondary electrons emitted from the irradiation position;
    the memory stores the irradiation position and the distribution information of the secondary electrons emitted from the irradiation position in association with each other; and
    the control apparatus is configured to:
  calculate a pixel value for each irradiation position on a basis of the stored distribution information of the secondary electrons for each irradiation position, and to form an image by associating the calculated pixel value with each irradiation position.

8. The charged particle beam device according to claim 7, wherein the detector is a charge coupled device (CCD).

9. The charged particle beam device according to claim 7, further comprising:
  a display apparatus which displays thereon a detection location of the detected secondary electrons.

10. The charged particle beam device according to claim 7, wherein the control apparatus:
  compares distribution information of secondary electrons for each irradiation position with each other, and
  acquires charging information of the sample on a basis of the compared distribution information.

11. The charged particle beam device according to claim 7, wherein the control apparatus is further configured to:
  compare distribution information of secondary electrons for each irradiation position with each other, and
  acquire depth information from a sample surface regarding an element contained in the sample on a basis of the compared distribution information.

12. The charged particle beam device according to claim 7, wherein:
  the deflector deflects the secondary electrons generated in different directions from a sample surface toward the detector at deflection angles depending on the directions; and
  the control apparatus is further configured to:
    compare the distribution information of the secondary electrons for each irradiation position with each other, and
    acquire profile information of the sample on a basis of the compared distribution information.

13. The charged particle beam device according to claim 7, wherein:
  the deflector deflects Auger electrons emitted from different elements toward the detector at deflection angles depending on the elements; and
  the control apparatus is further configured to:
    compare distribution information of Auger electrons for each irradiation position with each other, and
    identify an element contained in the sample on a basis of the compared distribution information.

14. A method of forming a sample image, the method comprising steps of:
  scanning a sample with a primary charged particle beam emitted from a charged particle source;
  deflecting secondary electrons having energy differences which are generated from a primary electron beam irradiation point of the sample by irradiation with the primary charged particle beam at deflection angles that are variable depending on the energy,
  detecting the deflected secondary electrons with detection elements arranged in a planar manner;
  calculating a pixel value for each irradiation position on a basis of distribution information of a detection position of the detected secondary signal electrons; and
  forming an image by associating the calculated pixel value with each irradiation position.

15. The sample image forming method according to claim 14, wherein:
  distribution information of secondary electrons for each irradiation position are compared with each other; and
  a sample image showing charging information of the sample is formed on a basis of the compared distribution information.

16. The sample image forming method according to claim 14, wherein:
  distribution information of secondary electrons for each irradiation position are compared with each other; and
  a sample image showing depth information from a sample surface regarding an element contained in the sample is formed on a basis of the compared distribution information.

17. The sample image forming method according to claim 14, wherein:
- secondary electrons generated in different directions from a sample surface are deflected at deflection angles depending on the directions and are detected with the detection elements arranged in a planar manner;
- the distribution information of the secondary electrons for each irradiation position with each other; and
- a sample image showing a profile of the sample is formed on a basis of the compared distribution information.

18. The sample image forming method according to claim 14, wherein:
- Auger electrons emitted from different elements are deflected at deflection angles depending on the elements and are detected with the detection elements arranged in a planar manner;
- distribution information of Auger electrons for each irradiation position are compared with each other; and
- a sample image showing an element contained in the sample is formed on a basis of the compared distribution information.

* * * * *